United States Patent
Wright et al.

(10) Patent No.: US 8,570,073 B2
(45) Date of Patent: *Oct. 29, 2013

(54) LOAD DRIVER

(75) Inventors: David Wright, San Diego, CA (US);
Jason Muriby, San Diego, CA (US);
Erhan Hancioglu, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/100,876

(22) Filed: May 4, 2011

(65) Prior Publication Data

US 2011/0234264 A1  Sep. 29, 2011

Related U.S. Application Data

(63) Continuation of application No. 11/843,216, filed on Aug. 22, 2007, now Pat. No. 8,164,365.

(60) Provisional application No. 60/912,577, filed on Apr. 18, 2007.

(51) Int. Cl.
*H03B 1/00* (2006.01)

(52) U.S. Cl.
USPC .................. 327/108; 327/112; 327/170

(58) Field of Classification Search
USPC .......... 327/108–112, 170; 326/26, 27, 82, 83, 326/87
See application file for complete search history.

(56) References Cited

U.S. PATENT DOCUMENTS

| | | | |
|---|---|---|---|
| 4,061,987 | A | 12/1977 | Nagahama |
| 4,075,536 | A | 2/1978 | Stevens |
| 4,242,604 | A | 12/1980 | Smith |
| 4,272,760 | A | 6/1981 | Prazak et al. |
| 4,344,067 | A | 8/1982 | Lee |
| 4,571,507 | A | 2/1986 | Collings |
| 4,684,824 | A | 8/1987 | Moberg |
| 4,689,581 | A | 8/1987 | Talbot |
| 4,689,740 | A | 8/1987 | Moelands et al. |
| 4,692,718 | A | 9/1987 | Roza et al. |
| 4,692,760 | A | 9/1987 | Unno et al. |
| 4,736,123 | A | 4/1988 | Miyazawa et al. |
| 4,797,580 | A | 1/1989 | Sunter |
| 4,839,636 | A | 6/1989 | Zeiss |
| 4,855,683 | A | 8/1989 | Troudet et al. |
| 4,868,525 | A | 9/1989 | Dias |
| 4,882,549 | A | 11/1989 | Galani et al. |

(Continued)

FOREIGN PATENT DOCUMENTS

| | | |
|---|---|---|
| EP | 1625506 A | 2/2006 |
| JP | 287113 A1 | 11/1988 |

(Continued)

OTHER PUBLICATIONS

USPTO Advisory Action for U.S. Appl. No. 09/989,570 dated Aug. 14, 2003; 3 pages.

(Continued)

*Primary Examiner* — Long Nguyen

(57) ABSTRACT

A method for driving a load includes driving a load to an initial voltage within a voltage window, the voltage window based on an input voltage and an offset voltage, and driving the load to approximately the input voltage.

20 Claims, 3 Drawing Sheets

(56) References Cited

U.S. PATENT DOCUMENTS

| | | |
|---|---|---|
| 4,947,169 A | 8/1990 | Smith et al. |
| 4,980,653 A | 12/1990 | Shepherd |
| 4,988,983 A | 1/1991 | Wehrer |
| 5,019,729 A | 5/1991 | Kimura et al. |
| 5,036,300 A | 7/1991 | Nicolai |
| 5,043,655 A | 8/1991 | Anholm, Jr. et al. |
| 5,073,757 A | 12/1991 | George |
| 5,095,280 A | 3/1992 | Wunner et al. |
| 5,111,081 A | 5/1992 | Atallah |
| 5,140,197 A | 8/1992 | Grider |
| 5,142,247 A | 8/1992 | Lada, Jr. et al. |
| 5,144,254 A | 9/1992 | Wilke |
| 5,150,079 A | 9/1992 | Williams et al. |
| 5,175,884 A | 12/1992 | Suarez |
| 5,200,751 A | 4/1993 | Smith |
| 5,268,599 A | 12/1993 | Matsui |
| 5,289,138 A | 2/1994 | Wang |
| 5,304,955 A | 4/1994 | Atriss et al. |
| 5,319,370 A | 6/1994 | Del Signore et al. |
| 5,321,319 A | 6/1994 | Mahmood |
| 5,345,195 A | 9/1994 | Cordoba et al. |
| 5,349,544 A | 9/1994 | Wright et al. |
| 5,355,033 A | 10/1994 | Jang |
| 5,381,116 A | 1/1995 | Nuckolls et al. |
| 5,408,191 A | 4/1995 | Han et al. |
| 5,420,543 A | 5/1995 | Lundberg et al. |
| 5,428,319 A | 6/1995 | Marvin et al. |
| 5,432,665 A | 7/1995 | Hopkins |
| 5,440,305 A | 8/1995 | Signore et al. |
| 5,446,867 A | 8/1995 | Young et al. |
| 5,451,912 A | 9/1995 | Torode |
| 5,473,285 A | 12/1995 | Nuckolls et al. |
| 5,481,179 A | 1/1996 | Keeth |
| 5,495,205 A | 2/1996 | Parker et al. |
| 5,506,875 A | 4/1996 | Nuckolls et al. |
| 5,511,100 A | 4/1996 | Lundberg et al. |
| 5,525,933 A | 6/1996 | Matsuki et al. |
| 5,546,433 A | 8/1996 | Tran et al. |
| 5,552,748 A | 9/1996 | O'Shaughnessy |
| 5,554,942 A | 9/1996 | Herr et al. |
| 5,559,502 A | 9/1996 | Schutte |
| 5,563,553 A | 10/1996 | Jackson |
| 5,565,819 A | 10/1996 | Cooper |
| 5,583,501 A | 12/1996 | Henrion et al. |
| 5,589,783 A | 12/1996 | McClure |
| 5,594,612 A | 1/1997 | Henrion |
| 5,604,466 A | 2/1997 | Dreps et al. |
| 5,608,770 A | 3/1997 | Noguchi et al. |
| 5,610,550 A | 3/1997 | Furutani |
| 5,610,955 A | 3/1997 | Bland |
| 5,614,869 A | 3/1997 | Bland |
| 5,642,027 A | 6/1997 | Windes et al. |
| 5,644,254 A | 7/1997 | Boudry |
| 5,666,118 A | 9/1997 | Gersbach |
| 5,668,506 A | 9/1997 | Watanabe et al. |
| 5,670,915 A | 9/1997 | Cooper et al. |
| 5,673,004 A | 9/1997 | Park |
| 5,675,813 A | 10/1997 | Holmdahl |
| 5,682,049 A | 10/1997 | Nguyen |
| 5,684,434 A | 11/1997 | Mann et al. |
| 5,686,863 A | 11/1997 | Whiteside |
| 5,689,196 A | 11/1997 | Schutte |
| 5,699,024 A | 12/1997 | Manlove et al. |
| 5,703,537 A | 12/1997 | Bland et al. |
| 5,703,540 A | 12/1997 | Gazda et al. |
| 5,726,597 A | 3/1998 | Petty et al. |
| 5,729,165 A | 3/1998 | Lou et al. |
| 5,796,312 A | 8/1998 | Hull et al. |
| 5,805,909 A | 9/1998 | Diewald |
| 5,818,370 A | 10/1998 | Sooch et al. |
| 5,825,317 A | 10/1998 | Anderson et al. |
| 5,845,151 A | 12/1998 | Story et al. |
| 5,845,181 A | 12/1998 | Bartscher |
| 5,867,015 A | 2/1999 | Corsi et al. |
| 5,870,004 A | 2/1999 | Lu |
| 5,870,345 A | 2/1999 | Stecker |
| 5,872,464 A | 2/1999 | Gradinariu |
| 5,877,656 A | 3/1999 | Mann et al. |
| 5,898,345 A | 4/1999 | Namura et al. |
| 5,949,408 A | 9/1999 | Kang et al. |
| 6,040,707 A * | 3/2000 | Young et al. ................. 327/111 |
| 6,124,840 A | 9/2000 | Kwon |
| 6,141,007 A | 10/2000 | Lebling et al. |
| 6,157,266 A | 12/2000 | Tsai et al. |
| 6,191,660 B1 | 2/2001 | Mar et al. |
| 6,199,969 B1 | 3/2001 | Haflinger et al. |
| 6,211,739 B1 | 4/2001 | Snyder et al. |
| 6,215,835 B1 | 4/2001 | Kyles |
| 6,219,736 B1 | 4/2001 | Klingman |
| 6,225,992 B1 | 5/2001 | Hsu et al. |
| 6,266,715 B1 | 7/2001 | Loyer et al. |
| 6,294,962 B1 | 9/2001 | Mar |
| 6,297,705 B1 | 10/2001 | Williams et al. |
| 6,357,011 B2 | 3/2002 | Gilbert |
| 6,407,641 B1 | 6/2002 | Williams et al. |
| 6,433,645 B1 | 8/2002 | Mann et al. |
| 6,466,036 B1 | 10/2002 | Philipp |
| 6,515,551 B1 | 2/2003 | Mar et al. |
| 6,525,616 B1 | 2/2003 | Williams et al. |
| 6,646,514 B2 | 11/2003 | Sutliff et al. |
| 6,701,508 B1 | 3/2004 | Bartz et al. |
| 6,708,233 B1 | 3/2004 | Fuller et al. |
| 6,708,247 B1 | 3/2004 | Barret et al. |
| 6,710,788 B1 | 3/2004 | Freach et al. |
| 6,742,076 B2 | 5/2004 | Wang et al. |
| 6,753,739 B1 | 6/2004 | Mar et al. |
| 6,807,109 B2 * | 10/2004 | Tomishima ............... 365/189.05 |
| 6,812,678 B1 | 11/2004 | Brohlin |
| 6,909,414 B2 | 6/2005 | Tsuchi et al. |
| 6,922,063 B2 | 7/2005 | Heger |
| 6,946,920 B1 | 9/2005 | Williams et al. |
| 6,960,953 B2 | 11/2005 | Ichihara |
| 6,961,665 B2 | 11/2005 | Slezak |
| 6,966,039 B1 | 11/2005 | Bartz et al. |
| 6,989,659 B2 | 1/2006 | Menegoli et al. |
| 7,010,773 B1 | 3/2006 | Bartz et al. |
| 7,139,999 B2 | 11/2006 | Bowman-Amuah |
| 7,170,257 B2 | 1/2007 | Oh |
| 7,212,183 B2 | 5/2007 | Tobita |
| 7,276,977 B2 | 10/2007 | Self |
| 7,319,999 B2 | 1/2008 | Evans |
| 7,348,861 B1 | 3/2008 | Wu et al. |
| 7,375,593 B2 | 5/2008 | Self |
| 7,391,204 B2 | 6/2008 | Bicking |
| 7,397,226 B1 | 7/2008 | Mannama et al. |
| 7,439,777 B2 | 10/2008 | Wood |
| 7,446,747 B2 | 11/2008 | Youngblood et al. |
| 7,576,582 B2 | 8/2009 | Lee et al. |
| 7,600,156 B2 | 10/2009 | Thornley et al. |
| 7,612,527 B2 | 11/2009 | Hoffman et al. |
| 7,631,111 B2 | 12/2009 | Monks et al. |
| 7,932,774 B2 | 4/2011 | Bonaccio et al. |
| 8,085,020 B1 | 12/2011 | Bennett |
| 2001/0040569 A1 | 11/2001 | Liang |
| 2002/0033804 A1 | 3/2002 | Liang et al. |
| 2003/0122734 A1 | 7/2003 | Chien et al. |
| 2003/0233631 A1 | 12/2003 | Curry et al. |
| 2004/0046724 A1 | 3/2004 | Woo et al. |
| 2004/0056833 A1 | 3/2004 | Kitagawa et al. |
| 2004/0070559 A1 | 4/2004 | Liang |
| 2004/0145551 A1 | 7/2004 | Tobita |
| 2004/0189573 A1 | 9/2004 | Lee et al. |
| 2004/0201627 A1 | 10/2004 | Maddocks et al. |
| 2004/0217799 A1 | 11/2004 | Ichihara |
| 2004/0250231 A1 | 12/2004 | Killian et al. |
| 2005/0057482 A1 | 3/2005 | Youngblood et al. |
| 2005/0140659 A1 | 6/2005 | Hohl et al. |
| 2006/0033474 A1 | 2/2006 | Shum |
| 2006/0244739 A1 | 11/2006 | Tsai |
| 2007/0024544 A1 | 2/2007 | Chung et al. |
| 2007/0029975 A1 | 2/2007 | Martin et al. |
| 2007/0139338 A1 | 6/2007 | Lin et al. |
| 2007/0170931 A1 | 7/2007 | Snyder |
| 2008/0036473 A1 | 2/2008 | Jansson |

(56) References Cited

U.S. PATENT DOCUMENTS

| | | | |
|---|---|---|---|
| 2008/0131145 | A1 | 6/2008 | Tao et al. |
| 2008/0203977 | A1 | 8/2008 | Raimar et al. |
| 2008/0224667 | A1 | 9/2008 | Tanaka et al. |
| 2008/0258740 | A1 | 10/2008 | Wright et al. |
| 2008/0258797 | A1* | 10/2008 | Wright et al. ............... 327/332 |
| 2008/0259017 | A1 | 10/2008 | Wright et al. |
| 2008/0259065 | A1 | 10/2008 | Wright et al. |
| 2008/0259070 | A1 | 10/2008 | Snyder et al. |
| 2008/0263243 | A1 | 10/2008 | Wright et al. |
| 2008/0263260 | A1 | 10/2008 | Snyder et al. |
| 2011/0248692 | A1 | 10/2011 | Shehu et al. |
| 2012/0013322 | A1 | 1/2012 | Dearborn |

FOREIGN PATENT DOCUMENTS

| | | | |
|---|---|---|---|
| JP | 291161 | A1 | 11/1990 |
| JP | 297223 | A1 | 12/1991 |
| JP | 5041651 | A | 2/1993 |
| WO | WO8906456 | A1 | 7/1989 |
| WO | PCTUS9617305 | A1 | 6/1996 |
| WO | WO9736230 | A1 | 10/1997 |
| WO | PCTUS9834376 | A1 | 8/1998 |
| WO | PCTUS9909712 | A1 | 2/1999 |

OTHER PUBLICATIONS

USPTO Advisory Action for U.S. Appl. No. 10/339,115 dated Jul. 29, 2004; 3 pages.
USPTO Advisory Action for U.S. Appl. No. 11/855,281 dated Mar 3, 2011; 4 pages.
USPTO Advisory Action for U.S. Appl. No. 11/857,970 dated Jan. 6, 2011; 2 pages.
USPTO Advisory Action for U.S. Appl. No. 11/965,485 dated Jun. 14, 2011; 3 pages.
USPTO Advisory Action for U.S. Appl. No. 11/965,485 dated Nov. 21, 2012; 3 pages.
USPTO Advisory Action for U.S. Appl. No. 11/965,520 dated Aug. 23, 2011; 3 pages.
USPTO Advisory Action for U.S. Appl. No. 11/985,520 dated Oct. 17, 2012; 2 pages.
USPTO Final Rejection for U.S. Appl. No. 08/868,079 dated Jan. 27, 1999; 7 pages.
USPTO Final Rejection for U.S. Appl. No. 08/868,079 dated Sep. 20, 2000; 4 pages.
USPTO Final Rejection for U.S. Appl. No. 08/868,079 dated Dec. 17, 1999; 7 pages.
USPTO Final Rejection for U.S. Appl. No. 09/048,905 dated Feb. 8, 2002; 6 pages.
USPTO Final Rejection for U.S. Appl. No. 09/048,905 dated Oct. 15, 1999; 8 pages.
USPTO Final Rejection for U.S. Appl. No. 09/207,912 dated Oct. 11, 2000; 5 pages.
USPTO Final Rejection for U.S. Appl. No. 09/275,336 dated Aug. 31, 2000; 5 pages.
USPTO Final Rejection for U.S. Appl. No. 09/511,019 dated Nov. 29, 2001; 5 pages.
USPTO Final Rejection for U.S. Appl. No. 09/721,316 dated May 3, 2002; 5 pages.
USPTO Final Rejection for U.S. Appl. No. 09/966,626 dated Jun. 26, 2002; 5 pages.
USPTO Final Rejection for U.S. Appl. No. 09/989,570 dated May 30, 2003; 9 pages.
USPTO Final Rejection for U.S. Appl. No. 09/989,571 dated Jan. 26, 2005; 11 pages.
USPTO Final Rejection for U.S. Appl. No. 10/339,115 dated Jun. 24, 2004; 5 pages.
USPTO Final Rejection for U.S. Appl. No. 11/768,677, dated Jul. 27, 2009: 12 pages.
USPTO Final Rejection for U.S. Appl. No. 11/855,281 dated Dec. 16, 2010; 13 pages.
USPTO Final Rejection for U.S. Appl. No. 11/857,970 dated Sep. 1, 2010; 29 pages.
USPTO Final Rejection for U.S. Appl. No. 11/857,970 dated Oct. 22, 2010; 24 pages.
USPTO Final Rejection for U.S. Appl. No. 11/857,970 dated Aug. 19, 2009; 22 pages.
USPTO Final Rejection for U.S. Appl. No. 11/864,137 dated Apr. 12, 2011; 12 pages.
USPTO Final Rejection for U.S. Appl. No. 11/965,485 dated Apr. 13, 2011; 15 pages.
USPTO Final Rejection for U.S. Appl. No. 11/965,520 dated Jun. 8, 2011; 14 pages.
USPTO Final Rejection for U.S. Appl. No. 11/965,520 dated Aug. 6, 2012; 13 pages.
USPTO Final Rejection for U.S. Appl. No. 11/983,578 dated May 8, 2012; 11 pages.
USPTO Final Rejection for U.S. Appl. No. 13/332,178 dated Oct. 2, 2012; 19 pages.
USPTO Non-Final Rejection for U.S. Appl. No. 08/259,323 dated Oct. 6, 1994; 7 pages.
USPTO Non-Final Rejection for U.S. Appl. No. 08/549,915 dated May 24, 1996; 3 pages.
USPTO Non-Final Rejection for U.S. Appl. No. 08/696,008 dated Apr. 6, 1998; 12 pages.
USPTO Non-Final Rejection for U.S. Appl. No. 08/696,008 dated Oct. 3, 1997; 3 pages.
USPTO Non-Final Rejection for U.S. Appl. No. 08/865,342 dated Feb. 3, 1998; 3 pages.
USPTO Non-Final Rejection for U.S. Appl. No. 08/865,342 dated Apr. 8, 1998; 5 pages.
USPTO Non-Final Rejection for U.S. Appl. No. 08/868,079 dated Jan. 22, 1998; 7 pages.
USPTO Non-Final Rejection for U.S. Appl. No. 08/868,079 dated Apr. 12, 2000; 6 pages.
USPTO Non-Final Rejection for U.S. Appl. No. 08/868,079 dated Jul. 1, 1999; 6 pages.
USPTO Non-Final Rejection for U.S. Appl. No. 09/048,905 dated Feb. 15, 2001; 12 pages.
USPTO Non-Final Rejection for U.S. Appl. No. 09/048,905 dated Jun. 3, 1999; 5 pages.
USPTO Non-Final Rejection for U.S. Appl. No. 09/048,905 dated Aug. 22, 2000; 12 pages.
USPTO Non-Final Rejection for U.S. Appl. No. 09/207,912 dated Jan. 26, 2001; 4 pages.
USPTO Non-Final Rejection for U.S. Appl. No. 09/207,912 dated Apr. 19, 2000; 5 pages.
USPTO Non-Final Rejection for U.S. Appl. No. 09/207,912 dated Nov. 10, 1999; 6 pages.
USPTO Non-Final Rejection for U.S. Appl. No. 09/275,336 dated Apr. 21, 2000; 6 pages.
USPTO Non-Final Rejection for U.S. Appl. No. 09/511,019 dated May 4, 2001; 5 pages.
USPTO Non-Final Rejection for U.S. Appl. No. 09/511,020 dated Nov. 28, 2000; 4 pages.
USPTO Notice of Allowance for U.S. Appl. No. 11/768,677 dated Jun. 9, 2011; 9 pages.
USPTO Notice of Allowance for U.S. Appl. No. 11/768,677 dated Jul. 1, 2010; 7 pages.
USPTO Notice of Allowance for U.S. Appl. No. 11/768,877 dated Nov. 9, 2010; 8 pages.
USPTO Notice of Allowance for U.S. Appl. No. 11/843,216 dated Feb. 22, 2010; 6 pages.
USPTO Notice of Allowance for U.S. Appl. No. 11/843,216 dated Mar. 1, 2012; 7 pages.
USPTO Notice of Allowance for U.S. Appl. No. 11/843,216 dated Apr. 19, 2011; 7 pages.
USPTO Notice of Allowance for U.S. Appl. No. 11/843,216 dated Jun. 15, 2010; 6 pages.
USPTO Notice of Allowance for U.S. Appl. No. 11/843,216 dated Dec. 29, 2011; 7 pages.
USPTO Notice of Allowance for U.S. Appl. No. 11/983,578 dated Jul. 25, 2012; 5 pages.

(56) References Cited

OTHER PUBLICATIONS

USPTO Notice of Allowance for U.S. Appl. No. 11/983,578 dated Oct. 15, 2012; 11 pages.
USPTO Notice of Allowance for U.S. Appl. No. 11/983,578 dated Dec. 6, 2012: 10 pages.
USPTO Notice of Allowance for U.S. Appl. No. 11/963,578 dated Jan. 31, 2013; 10 pages.
USPTO Notice of Allowance for U.S. Appl. No. 13/182,431 dated Oct. 12, 2012; 7 pages.
USPTO Notice of Allowance for U.S. Appl. No. 13/182,431 dated Nov. 28, 2012; 8 pages.
USPTO Requirement for Restriction for U.S. Appl. No. 13/432,036, dated Jan. 14, 2013; 5 pages.
Written Opinion of the International Searching Authority for Internationai Application No. PCT/US2008/60699 dated Jun. 18, 2009; 4 pages.
Yoshikawa et al., "An EPROM Cell Structure for EPLD's Compatible with Single Poly-Si Gate Processes," IEEE Transactions on Electron Devices, vol. 37, No. 3, Mar. 1990, pp. 875-679; 5 pages.
L. Richard Carley, "Trimming Analog Circuits Using Floating-Gate Analog MOS Memory," IEEE Journal of Solid-State Circuits, vol. 24, No. 6, Dec. 1969, pp. 1569-1575, 7 pages.
"An Analog PLL-Based Clock and Data Recovery Circuit with High Input Jitter Tolerance", by Sam Yinshang Sun, Reprinted from IEEE Journal of Solid-State Circuits, vol. SC-24, pp. 325-330, Apr. 1989, pp. 383-385.
U.S. Appl. No. 09/989,570 "Method for Facilitating Microcontroller Programming," Manfred Bartz et al., filed Nov. 19, 2001; 127 pages.
U.S. Appl. No. 09/989,571 "Method for Designing a Circuit for Programmable Microcontrollers," Manfred Bartz et al., filed Nov. 19, 2001; 38 pages.
U.S. Appl. No. 09/989,574 "Method and System for Using a Graphics User Interface for Programming an Electronic Device," Manfred Bartz et al., filed Nov. 19, 2001, 43 pages.
U.S. Appl. No. 11/768,677: "Self-Calibrating Driver for Charging a Capacitive Load to a Desired Voltage," Wright et al., filed Jun. 26, 2007; 19 pages.
U.S. Appl. No. 11/843,216 "Non-Resistive Load Driver." David Wright et al., filed Aug. 22, 2007; 18 pages.
U.S. Appl. No. 11/855,281 "Reducing Power Consumption in a Liquid Crystal Display," David Wright et al., filed Sep. 14, 2007; 26 pages.
U.S. Appl. No. 11/857,970: "Specialized Universal Serial Bus Controller," Wright, et al., filed Sep. 19, 2007; 23 pages.
U.S. Appl. No. 11/864,137 "Configurable Liquid Crystal Display Driver System," David Wrightet al., filed Sep. 28, 2007; 22 pages.
U.S. Appl. No. 11/965,485: "Display Interface Buffer," Snyder et al., filed Dec. 27, 2007; 28 pages.
U.S. Appl. No. 11/965,520 "Active Liquid Crystal Display Drivers and Duty Cycle Operation," Warren Snyder et al., filed Dec. 27, 2007; 28 pages.
U.S. Appl. No. 13/182,431: "Graphical User Interface for Dynamically Reconfiguring a Programmable Device," Matthew A. Pleis, filed Jul. 13, 2011; 57 pages.
U.S. Appl. No. 13/432,038: "Systems and Method for Starting Up Analog Circuits," Gary Moscaluk, dated Mar. 28, 2012; 24 pages.
U.S. Appl. No. 60/876,866 "Boost buffer aid for reference buffer," Nandakishore Raimar et al., filed Dec. 22, 2006; 18 pages.
Application No. PCT/US08/60675: "Dual Stage Drive Buffer," David G. Wright et al , Sep. 14, 2007; 26 pages.
Application No. PCT/US08/60706: "Non-Resistive Load Driver," filed Apr. 17, 2006; 18 pages.
Bakker et al,, "Micropower CMOS Temperature Sensor with Digital Output," IEEE Journal of Solid-State Circuits, Jul. 1996, 3 pages.
Cacharelis et al., "A Fully Modular 1 um CMOS Technology Incorporating EEPROM, EPROM and interpoly Capacitors." 20th European Solid State Device Research Conference, Nottingham, Sep. 1990, pp. 547-550; 4 pages.
Cacharelis et al., "A Modular 1 um CMOS Single Polysilicon EPROM PLD Technology," Aug. 1988 IEEE, pp. 60-IEDM 88 to 63-IEDM 88; 4 pages.
Cuppens et al.. "An EEPROM for Microprocessors and Custom Logic." IEEE Journal of Solid-State Circuits. vol. SC-20, No. 2, Apr. 1985, pp. 603-608, 6 pages.
CY7C63722/23 CY7C63742/43 enCoRe USB Combination Low-Speed USB & PS/2 Peripheral Controller, Cypress Semiconductor Corporation, Revised May 2000; 48 pages.
Cypress Semiconductor Marketing Brochure, "Timing Technology Products," Published Nov. 1993, a publication of Cypress Semiconductor in San Jose, CA, pp. 5-7; 5 pages.
Electronic Engineering Times, "TI's Quantum Leap," Issue 517, Dec. 19, 1988, pp. 1 and 86; 2 pages.
Frake et al., "A 9ns, Low Standby Power CMOS PLD with a Single-Poly EPROM Cell," 1989 IEEE International Solid-State Circuits Conference, Feb. 17, 1989, pp. 230-231 and 346; 3 pages.
Hoe et al , "Cell and Circuit Design for Single-Poly EPROM," IEEE Journal of Solid-State Circuits, vol. 24, No. 4, Aug. 1989, pp. 1153-1157: 5 pages.
International Search Report for International Application No. PCT/US08/60699 dated Jun. 18, 2009; 6 pages.
International Search Report for International Application PCT/US08/60702 mailed Sep. 3, 2008; 2 pages.
Jan Axelson, "USB Complete; Everything You Need to Develop USB Peripherals," 3rd Edition, Copyright 1999-2005, ISBN 978-1-931448-03-1, pp. 51-59, 85-91, 225; 20 pages.
Jinbin Zhao, et al , "Steady-State and Dynamic Analysis of a Buck Converter Using a Hysteretic PWM Control" Dated 2004; 5 pages.
Kazerounian et al., "A Single Poly EPROM for Custom CMOS Logic Applications," IEEE 1986 Custom Integrated Circuits Conference, 1986, pp. 59-62; 4 pages.
Kim et al., "A 30-MHz Hybrid Analog/Digital Clock Recovery Circuit in 2-um CMOS," IEEE Journal of Solid-State Circuits, vol. 25, No. 6, Dec. 1990, pp. 1385-1394, 10 pages.
Kim et al., "Low-Power High-Slew-Rate CMOS Buffer Amplifier for Flat Panel Display Drivers," Electronic Letters, Feb. 16, 2006, vol. 42, No. 4, <http://circuit.kaist.ac.kr/upload_files.pdf>; 2 pages.
Miyamoto et al., "An Experimental 5-V-Only 256-kbit CMOS EEPROM with a High-Performance Single-Polysilicon Cell," IEEE Journal of Solid State Circuits, vol. SC-21, No. 5, Oct. 1986, pp. 852-860, 9 pages.
Mohammad Al-Shyoukh and Hoi Lee__A Compact Fully-Integrated Extremum-Selector-Based Soft-Start Circuit for Voltage Regulators in Bulk CMOS Technologies__Oct. 2010__5 pages.
Ohsaki et al, "A Planar Type EEPROM Cell Structure by Standard CMOS Process and Applications," VLSI Technology, Digest of Technical Papers, May 1993; pp. 55-66; 2 pages.
Ohsaki et al., "A Planar Type EEPROM Cell Structure by Standard CMOS Process for lntegration with GATE Array, Standard Cell, Microprocessor and for Neural Chips," IEEE 1993 Custom Integrated Circuits Conference, 1993, pp. 23.6.1-23.64; 4 pages.
Ohsaki et al., "A Single Poly EEPROM Cell Structure for Use in Standard CMOS PRocesses," IEEE Journal of Solid-State Circuits, vol. 29, No. 3, Mar. 1994, pp. 311-316; 6 pages.
Ohsaki et al., "SIPPOS (Single Poly Pure CMOS) EEPROM Embedded FPGA by News Ring Interconnection and Highway Path," IEEE 1994 Custom Integrated Circuits Conference, 1994, pp. 189-192; 4 pages.
U.S. Appl. No. 61/566,233: "Fast Startup Circuit and Method for Ultra Low Power Analog Circuits," Gary Moscaluk, dated Dec. 2, 2011; 11 pages.
Robert A. Blauschild, "WP 3.5: An Integrated time Reference." ISSCC94/Session 3, Analog Techniques/Paper WP 3.5, Feb. 1994, pp. 56-58; 4 pages.
S.M. Sze, "Physics of Semiconductor Devices," 2nd Edition, John Wiley & Sons, New York, 1981, pp. 496-506; 13 pages.
Search Report for U.S. Appl. No. 13/432,038, Dated Mar. 2012, 12 pages.
Sugino et al., "Analysis of Writing and Erasing Procedure of Flotox EEPROM Using the New Charge Balance Condition (CBC) Model," NUPAD IV, May and Jun. 1992, pp. 65-69; 5 pages.

(56) References Cited

OTHER PUBLICATIONS

T.J. Giles, "A University Frequency Synthesizer IC," Aug. 1979, Philips Telecommunication Review, vol. 37, No. 3, pp. 177-181; 6 pages.
Takebuchi et al., "A Novel Integration Technology of EEPROM Embedded CMOS LOGIC VLSI Suitable for ASIC Applications," IEEE 1992 Custom Integrated Circuits Conference, 1992, pp. 9.6.1-9.6.4; 4 pages.
The Written Opinion of the International Searching Authority for International Application PCT/US08/60702 mailed Sep. 3, 2008; 4 pages.
Universal Serial Bus Specification, Chapter 7—Electrical, Version 1.0; Jan. 15, 1996, pp. 111-143; 34 pages.
USPTO Advisory Action for U.S. Appl. No. 08/868,079 dated Mar. 26, 1999; 2 pages.
USPTO Advisory Action for U.S. Appl. No. 09/207,912 dated Dec. 22, 2000; 1 page.
USPTO Non-Final Rejection for U.S. Appl. No. 09/721,316 dated Apr. 24, 2001; 4 pages.
USPTO Non-Final Rejection for U.S. Appl. No. 09/721,316 dated Aug. 7, 2001; 3 pages.
USPTO Non-Final Rejection for U.S. Appl. No. 09/966,626 dated Dec. 6, 2001; 6 pages.
USPTO Non-Final Rejection for U.S. Appl. No. 09/989,570 dated Jan. 2, 2003; 7 pages.
USPTO Non-Final Rejection for U.S. Appl. No. 09/989,570 dated Jan. 26, 2005; 9 pages.
USPTO Non-Final Rejection for U.S. Appl. No. 09/989,570 dated Mar. 25, 2004; 8 pages.
USPTO Non-Final Rejection for U.S. Appl. No. 09/989,570 dated Oct. 7, 2003; 6 pages.
USPTO Non-Final Rejection for U.S. Appl. No. 09/989,571 dated May 23, 2005; 8 pages.
USPTO Non-Final Rejection for U.S. Appl. No. 09/989,571 dated Jul. 12, 2004; 9 pages.
USPTO Non-Final Rejection for U.S. Appl. No. 10/324,455 dated Aug. 21, 2003, 4 pages.
USPTO Non-Final Rejection for U.S. Appl. No. 10/324,455 dated Nov. 6, 2003; 4 pages.
USPTO Non-Final Rejection for U.S. Appl. No. 10/339,115 dated Jan. 28, 2004; 4 pages.
USPTO Non-final Rejection for U.S. Appl. No. 10/339,115 dated Oct. 2, 2003; 3 pages.
USPTO Non-Final Rejection for U.S. Appl. No. 11/768,677 dated Jan. 6, 2010; 11 pages.
USPTO Non-Final Rejection for U.S. Appl. No. 11/768,677 dated Feb. 9, 2009; 10 pages.
USPTO Non-Final Rejection for U.S. Appl. No. 11/843,216 dated Oct. 6, 2009; 7 pages.
USPTO Non-Final Rejection for U.S. Appl. No. 11/855,281 dated Jan. 22, 2013; 8 pages.
USPTO Non-Final Rejection for U.S. Appl. No. 11/855,281 dated Jul. 1, 2010; 10 pages.
USPTO Non-Final Rejection for U.S. Appl. No. 11/857,970 dated Mar. 7, 2011; 32 pages.
USPTO Non-Final Rejection for U.S. Appl. No. 11/857,970 dated Mar. 10, 2010; 26 pages.
USPTO Non-Final Rejection for U.S. Appl. No. 11/857,970 dated Mar. 18, 2009; 21 pages.
USPTO Non-Final Rejection for U.S. Appl. No. 11/864,137 dated Jul. 7, 2010; 9 pages.
USPTO Non-Final Rejection for U.S. Appl. No. 11/864,137 dated Oct. 29, 2010; 10 pages.
USPTO Non-Final Rejection for U.S. Appl. No. 11/965,485 dated Oct. 1, 2010; 12 pages.
USPTO Non-Final Rejection for U.S. Appl. No. 11/965,520 dated Sep. 29, 2010; 11 pages.
USPTO Non-Final Rejection for U.S. Appl. No. 11/965,520 dated Dec. 18, 2012; 13 pages.
USPTO Non-Final Rejection for U.S. Appl. No. 11/983,578 dated Oct. 7, 2011; 7 pages.
USPTO Non-Final Rejection for U.S. Appl. No. 13/182,431 dated Jul. 3, 2012; 7 pages.
USPTO Non-Final Rejection Number for U.S. Appl. No. 11/965,520 dated Dec. 7, 2011; 11pages.
USPTO Notice of Allowance for U.S. Appl. No. 08/259,323 dated Mar. 21, 1995; 1 page.
USPTO Notice of Allowance for U.S. Appl. No. 08/549,915 dated Apr. 8, 1997; 3 pages.
USPTO Notioe of Allowance for U.S. Appl. No. 08/696,008 dated Sep. 22, 1998; 4 pages.
USPTO Notice of Allowance for U.S. Appl. No. 08/865,342 dated Sep. 16, 1998; 1 page.
USPTO Notice of Allowance for U.S. Appl. No. 08/868,079 dated Nov. 14, 2000; 3 pages.
USPTO Notice of Allowance for U.S. Appl. No. 09/048,905 dated May 29, 2002; 4 pages.
USPTO Notice of Allowance for U.S. Appl. No. 09/207,912 dated May 7, 2001; 3 pages.
USPTO Notice of Allowance for U.S. Appl. No. 09/275,336 dated Sep. 27, 2000; 1 page.
USPTO Notice of Allowance for U.S. Appl. No. 09/511,019 dated Jan. 4, 2002; 4 pages.
USPTO Notice of Allowance for U.S. Appl. No. 09/511,020 dated May 2, 2001; 1 page.
USPTO Notice of Allowance for U.S. Appl. No. 09/721,316 dated Sep. 23, 2002; 5 pages.
USPTO Notice of Allowance for U.S. Appl. No. 09/968,628 dated Oct. 10, 2002; 8 pages.
USPTO Notice of Allowance for U.S. Appl. No. 09/989,570 dated May 19, 2005; 4 pages.
USPTO Notice of Allowance for U.S. Appl. No. 09/989,570 dated Sep. 10, 2004; 8 pages.
USPTO Notice of Allowance for U.S. Appl. No. 09/989,571 dated Sep. 13, 2005; 6 pages.
USPTO Notice of Allowance for U.S. Appl. No. 10/256,829 dated Sep. 12, 2012; 4 page.
USPTO Notice of Allowance for U.S. Appl. No. 10/256,829 dated Nov. 1, 2012; 2 pages.
USPTO Notice of Allowance for U.S. Appl. No. 10/265,829 dated Nov. 27, 2012; 5 pages.
USPTO Notice of Allowance for U.S. Appl. No. 10/324,455 dated Feb. 12, 2004; 4 pages.
USPTO Notice of Allowance for U.S. Appl. No. 10/339,115 dated Jan. 28, 2005; 6 pages.
USPTO Notice of Allowance for U.S. Appl. No. 11/768,677 dated Feb. 18, 2011; 9 pages.
"PSoC Mixed Signal Array," Final Data Sheet, Cypress Semiconductor Corporation, Apr. 24, 2007, Document No. 001-05356; 31 pages.
Robert Jania, "Cypress' CapSense Successive Approximation Algorithm," Whiat Paper CSA RJO.doc, Jan. 17, 2007; 6 pages.
USPTO Non-Final Rejection for U.S. Appl. No. 13/432,038, dated Mar. 7, 2013; 8 pages.
USPTO Final Rejection for U.S. Appl. No. 11/855,281, dated Jul. 5, 2013; 9 pages.
USPTO Final Rejection for U.S. Appl. No. 11/965,520, dated Jul. 8, 2013; 10 pages.
USPTO Notice of Allowance for U.S. Appl. No. 13/432,038, dated Jun. 12, 2013; 6 pages.

* cited by examiner

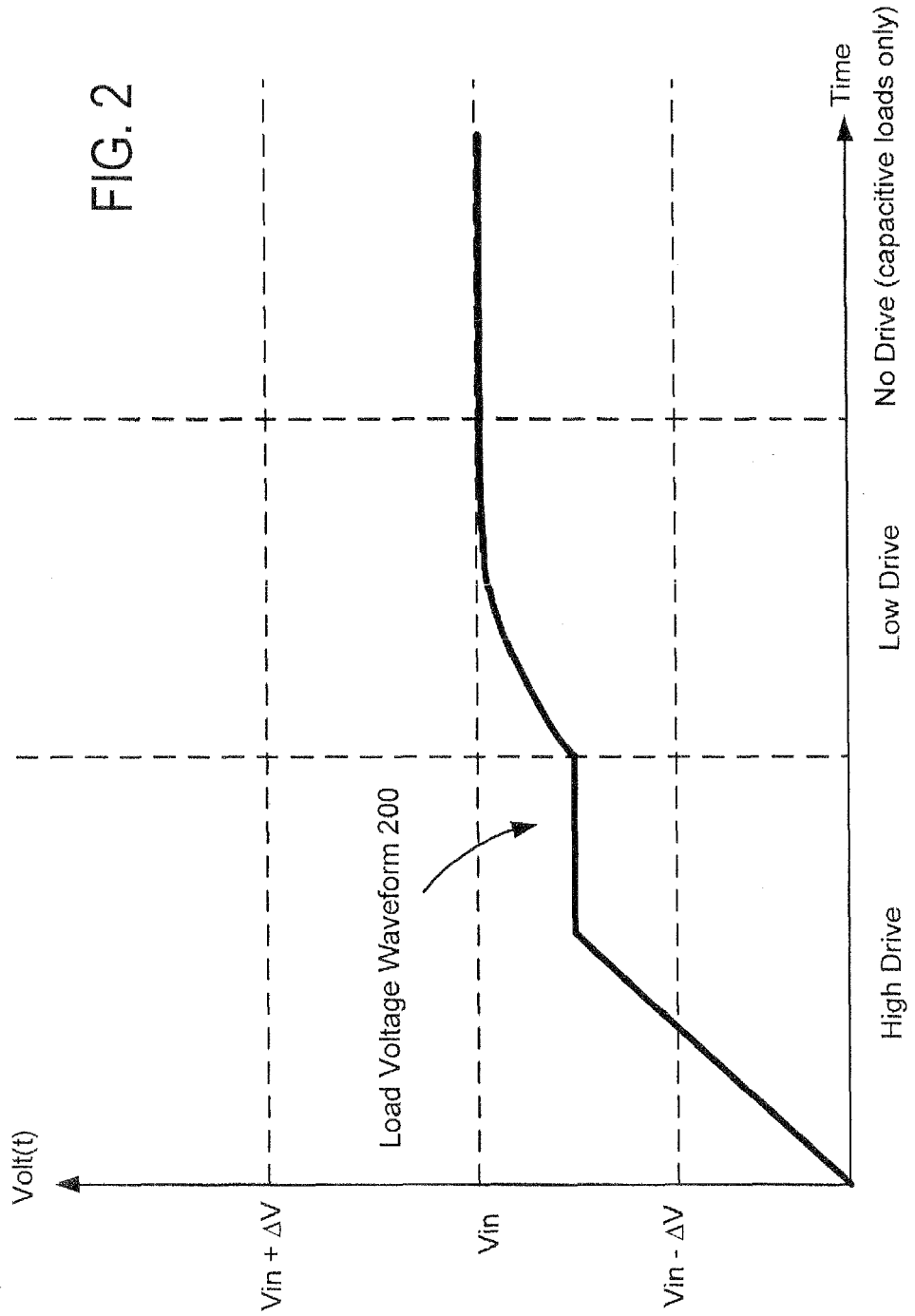

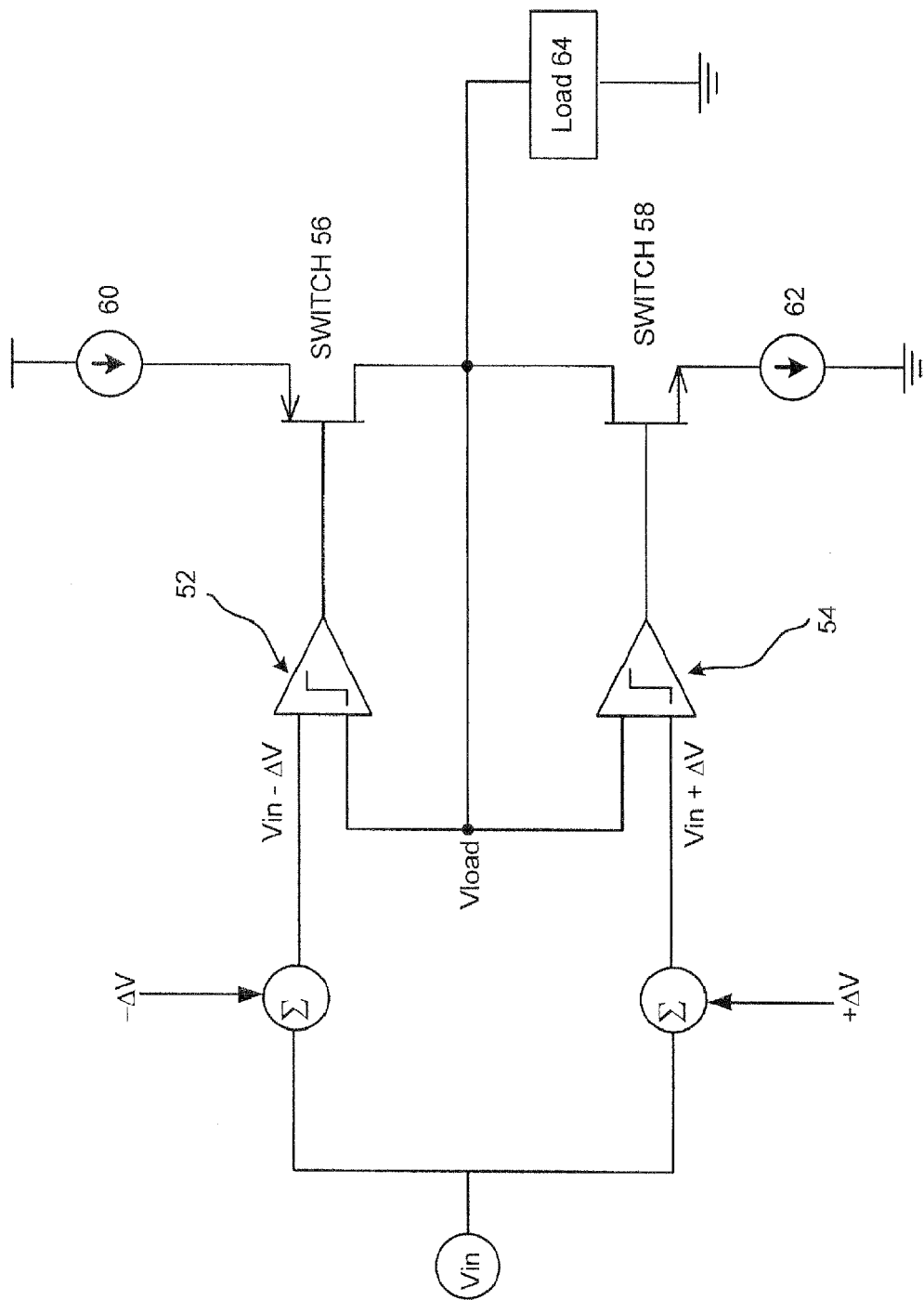

LOAD DRIVER

RELATED APPLICATIONS

This application is a continuation of U.S. patent application Ser. No. 11/843,216, filed Aug. 22, 2007 now U.S. Pat. No. 8,164,365, which claims the priority benefit of U.S. Provisional Patent Application No. 60/912,577, filed Apr. 18, 2007, each of which is incorporated herein by reference.

TECHNICAL FIELD

The present disclosure relates generally to integrated circuits, and more particularly to a method and apparatus to drive non-resistive loads.

BACKGROUND

A conventional load driver circuit may include an operational amplifier (Op-Amp) and a Metal-Oxide-Semiconductor (MOS) power transistor. The MOS power transistor defines a current path from its drain to its source upon receiving an appropriate drive signal at its gate. The gate of the MOS power transistor may be connected to an output of the Op-Amp that includes an inverting input and a non-inverting input. The inverting input of the Op-Amp may be connected to the source of the MOS power transistor via a feedback path. A load may be connected to the source or the drain of the MOS power transistor.

This conventional load driver circuit works well for driving resistive loads. However, there are several limitations when using this circuit to drive non-resistive loads, including capacitive loads, e.g., a liquid crystal display (LCD) panel, and inductive loads. For example, the conventional load driver circuit may become less stable when driving a non-resistive load, which in turn makes it difficult to drive rail-to-rail voltages to an output of the conventional load driver circuit. Additionally, the conventional load driver circuit may be less resilient to load variations. Any load variation may cause the circuit to become less stable. One solution may be to include capacitors in the feedback path of the conventional load driver circuit. But this solution increases the number of components in the conventional load driver circuit, thus increasing cost.

DESCRIPTION OF EXAMPLE EMBODIMENTS

Overview

A device includes a voltage generator to generate an input voltage; a first circuit to drive a voltage associated with a load to a threshold voltage level; and a second circuit to adjust the voltage associated with the load to approximate the input voltage, and to stabilize the voltage associated with the load. The device further includes a control logic having a control signal generator to generate signals to select between the first circuit and the second circuit.

A method includes providing an input voltage; driving a voltage associated with a load to a threshold level during a high-drive mode; adjusting the voltage associated with the load to approximate the input voltage during a low-drive mode; and stabilizing the voltage associated with the load during the low-drive mode. The method further includes generating control signals to select between a high-drive mode and a low-drive mode.

BRIEF DESCRIPTION OF THE DRAWINGS

The foregoing and other objects, advantages and features will become more readily apparent by reference to the following detailed description in conjunction with the accompanying drawings.

FIG. 2 is a diagram illustrating an example operation of the non-resistive load driver of FIG. 1 for an example load voltage waveform.

FIG. 3 is a schematic block diagram illustrating an example high-drive circuit of the non-resistive load driver of FIG. 1.

DETAILED DESCRIPTION

Figure 1:
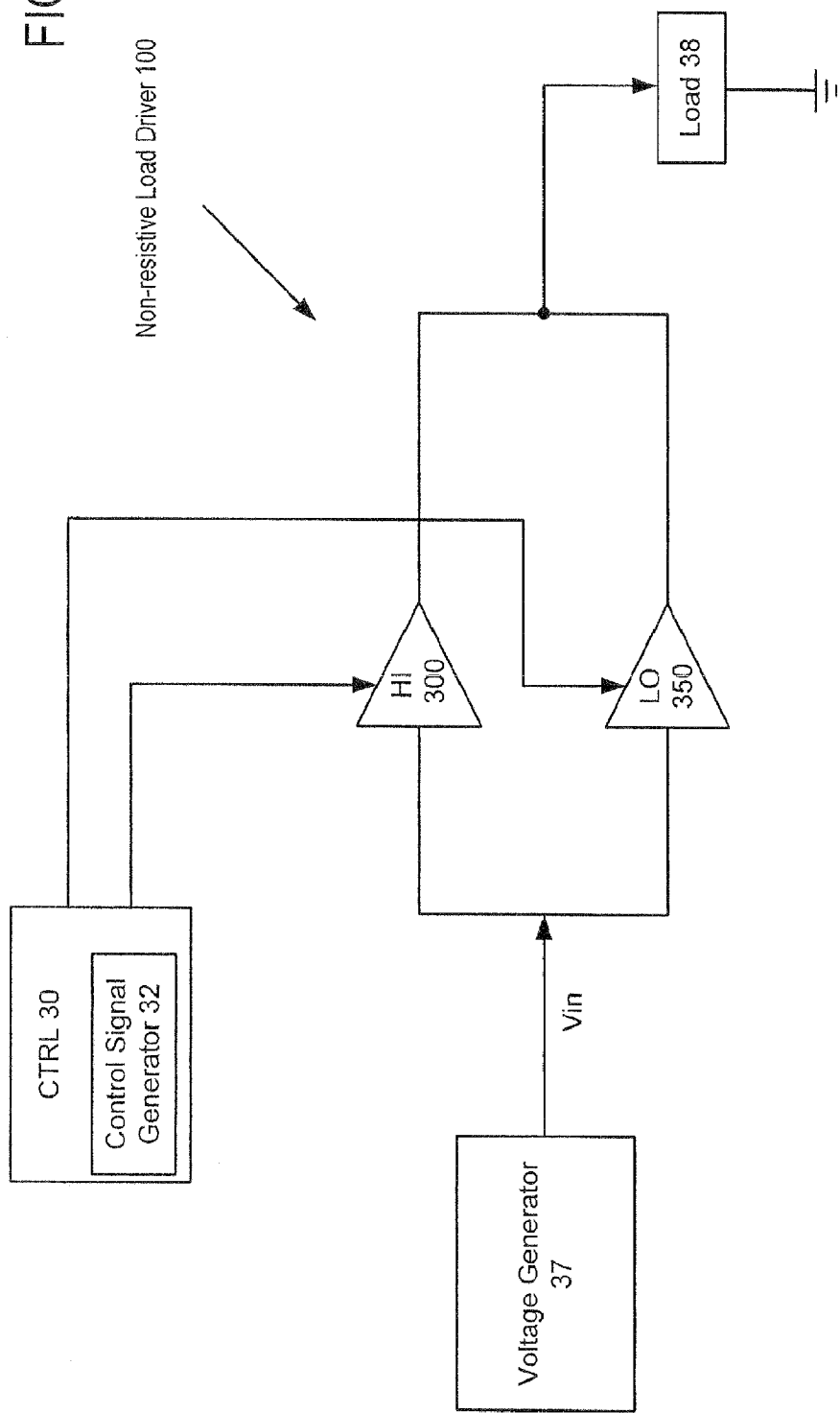
FIG. 1 is a schematic block diagram illustrating an example non-resistive load driver according to embodiments of the invention.

FIG. 1 is a schematic block diagram illustrating an example non-resistive load driver 100 according to embodiments of the invention. It should be recognized that FIG. 1 may include other elements, which are not illustrated in order to simplify the figures and which are not necessary to understand the example system disclosed below. The non-resistive load driver circuit 100 described and illustrated herein may be implemented in hardware, firmware, software, or any suitable combination thereof.

Referring to FIG. 1, the non-resistive load driver 100 may include a high-drive circuit 300 and a low-drive circuit 350 to drive rail-to-rail voltages at an output of the non-resistive load driver 100. The high-drive circuit 300 may actively drive the load 38 to a threshold voltage level, while the low-drive circuit 350 may modify the output voltage of the non-resistive load driver 100 (i.e., voltage level associated with the load 38) to approximate an input voltage Vin, as well as maintain a stable output voltage for the non-resistive load driver 100. Vin represents an input voltage to the non-resistive load driver 100. The input voltage Vin may be generated from a voltage generator 37. The control logic 30 includes a control signal generator 32 to generate appropriate control signals, to select either the high-drive circuit 300 or the low-drive circuit 350 to drive the load 38. The control logic 30 may also control the amount of time that each circuit 300 and 350 operates. The amount of time that each circuit 300 and 350 operates may be programmable for a dynamic switching between the circuits 300 and 350 or fixed depending on the load 38. In some embodiments, the non-resistive load driver 100 may drive capacitive loads, such as a liquid crystal display (LCD) panel.

In some embodiments, the non-resistive load driver 100 may operate in a high-drive mode and a low-drive mode to drive rail-to-rail voltages at an output of the non-resistive load driver 100. During the high-drive mode, the high-drive circuit 300 may be selected to actively drive the load 38 to a threshold voltage level. The threshold voltage level may offset the input voltage Vin by a small amount, and its value may be programmable or fixed. Subsequently, the non-resistive load driver 100 may switch to a low-drive mode in which the low-drive circuit 350 is activated. During the low-drive mode, the low-drive circuit 350 may modify the output voltage of the non-resistive load driver 100, i.e., voltage level associated with the load 38, to approximate the input voltage Vin. In addition, during the low-drive mode, the low-drive circuit 350 may stabilize the output voltage of the non-resistive load driver 100 to maintain a steady state. The low-drive circuit 350 consumes less current than the high-drive circuit 300, thereby reducing power consumption.

When driving an LCD panel, the non-resistive load driver 100 may cease to drive the LCD panel, or switch to a no-drive mode, after the output voltage of the non-resistive load driver 100 reaches a steady state. In this no-drive mode, both the high-drive circuit 300 and the low-drive circuit 350 may be turned off, further reducing power consumption. When driving non-capacitive loads, such as inductive loads, the low-drive circuit 350 may remain turned on to maintain an appropriate voltage at the output of the non-resistive load driver 100.

The control logic 30 may provide appropriate control signals to the non-resistive load driver 100 to indicate which mode of operation, e.g., the high-drive mode, the low-drive mode, or the no-drive mode, may be used for driving a non-resistive load. The timing associated with each of these modes may be programmable for a dynamic switching between the modes or fixed depending on the load 38. In some embodiments, the non-resistive load driver 100 may be implemented using two or more discrete drivers, such as a high-drive circuit 300 and a low-drive circuit 350, while in other embodiments, the non-resistive load driver 100 may be implemented using a single driver with two or more operational modes controllable by a bias current.

In some embodiments, the low-drive circuit 350 may include a chopper-stabilized amplifier that switches between an input and an output of the non-resistive load driver 100 to cancel out any offset voltages. A chopping frequency associated with the chopper-stabilized amplifier may be programmable when using the chopper-stabilized amplifier to drive non-resistive loads.

The above-described non-resistive load driver 100 includes a high-drive circuit 300 and a low-drive circuit 350 that allows for rail-to-rail output voltage drive capability while maintaining stability, when driving non-resistive loads. The non-resistive load driver 100 does not require additional capacitors to keep the circuit stable, thereby consuming less chip space. These external capacitors are typically required by the conventional load driver circuits to support large transient current flows. Additionally, the non-resistive load driver 100 consumes less power when driving non-resistive loads.

FIG. 2 is a diagram illustrating an example operation of the non-resistive load driver 100 of FIG. 1 for an example load voltage waveform 200. Referring to FIG. 2, the load voltage waveform 200 may represent instantaneous voltages associated with the load 38 as a function of time. Vin represents an input voltage to the non-resistive load driver 100. The input voltage Vin may be generated from the voltage generator 37 of FIG. 1. An offset voltage $\Delta V$ may be a relatively small voltage compared to the input voltage Vin. A voltage window (Vin−$\Delta V$, Vin+$\Delta V$) may be a voltage range to drive the output of the non-resistive load driver 100.

The non-resistive load driver 100 may operate in a high-drive mode such that the high-drive circuit 300 is selected to drive a load voltage to a value within the voltage window (Vin−$\Delta V$, Vin+$\Delta V$). The load voltage may offset the input voltage Vin by a small amount $\Delta V$. Subsequently, the non-resistive load driver 100 may switch to a low-drive mode. In one embodiment, the high-drive circuit may automatically turn off itself after charging to a certain threshold level, while the low-drive mode may be automatically and dynamically turned on/off to stabilize the output voltage. During the low-drive mode, the low-drive circuit 350 is selected to modify the load voltage to approximate the input voltage Vin, such as by canceling any offset voltages associated with the load voltage. In addition, the low-drive circuit 350 may also stabilize the load voltage to maintain a steady state. The low-drive circuit 350 consumes less current than the high-drive circuit 300, thus reducing power consumption. When driving capacitive loads, the non-resistive load driver 100 may switch to a no-drive mode after the load voltage reaches a steady state. During the no-drive mode, both the high-drive circuit 300 and the low-drive circuit 350 may be turned off, further reducing power consumption.

FIG. 3 is a schematic block diagram illustrating an example high-drive circuit 300 of the non-resistive load driver 100 of FIG. 1. Referring to FIG. 3, the example high-drive circuit 300 may include comparators 52 and 54, switches 56 and 58, current sources 60 and 62, to drive a load 64. Comparators 52 and 54 compare multiple voltages or currents and switch their respective output to indicate which voltage or current is larger. The output of comparators 52 and 54 controls switches 56 and 58, respectively. In some embodiments, the switch 56 may be a p-channel metal-oxide-semiconductor field-effect transistor (MOSFET) PMOS, whereas the switch 58 may be an NMOS. In other embodiments, the switches 56 and 58 may be any other device capable of performing the functions described herein.

Vin represents an input voltage to the high-drive circuit 300. The input voltage Vin may be generated from the voltage generator 37 of FIG. 1. An offset voltage $\Delta V$ may be a relatively small voltage compared to the input voltage Vin. A voltage window (Vin−$\Delta V$, Vin+$\Delta V$) may be a voltage range to drive the output of the high-drive circuit 300. A load voltage Vload may represent instantaneous voltages associated with the load 64 as a function of time.

The comparator 52 compares the value of the input voltage minus the offset voltage or Vin−$\Delta V$ with the load voltage Vload. In some embodiments, the comparator 52 outputs a "1" when Vin−$\Delta V$ is less than the load voltage Vload, thus directing the switch 56 to be turned off. Otherwise, the comparator 52 outputs a "0" when Vin−$\Delta V$ is greater than the load voltage Vload, thus directing the switch 56 to be turned on.

The Comparator 54 compares the value of the input voltage plus the offset voltage or Vin+$\Delta V$ with the load voltage Vload. When the load voltage Vload is less than Vin+$\Delta V$, the switch 58 is turned off. Otherwise, when the load voltage Vload is greater than Vin+$\Delta V$, the switch 58 is turned on.

When the switch 56 is on and the switch 58 is off, a large bias current may flow from the current source 60 to the load 64 to charge the load 64 until the load voltage Vload reaches a value within the window (Vin−$\Delta V$, Vin+$\Delta V$). Once the load voltage Vload is charged to a value within the window (Vin−$\Delta V$, Vin+$\Delta V$), both switches 56 and 58 may be off. When both switches 56 and 58 are off, the high-drive circuit 300 may be turned off to cease to drive the load 64. The low-drive circuit 350 may then be activated to modify or adjust the load voltage Vload to approximate the input voltage Vin and to stabilize the load voltage Vload.

On the other hand, when the switch 56 is off and the switch 58 is on, a large bias current may flow from the load 64 to the current source 62 to discharge the load 64 until the load voltage Vload reaches a value within the window (Vin−$\Delta V$, Vin+$\Delta V$). Once the load voltage Vload is discharged to a value within the window (Vin−$\Delta V$, Vin+$\Delta V$), both switches 56 and 58 may be off. When both switches 56 and 58 are off, the high-drive circuit 300 may be turned off to cease to drive the load 64. The low-drive circuit 350 may then be activated to modify or adjust the load voltage Vload to approximate the input voltage Vin and to stabilize the load voltage Vload.

Embodiments of the invention relate to a method and apparatus to drive non-resistive loads. The non-resistive load driver may include two or more drivers, such as a high-drive circuit 300 and a low-drive circuit 350, to drive rail-to-rail output voltages and to maintain a stable condition. The high-drive circuit may drive the output voltage to a threshold level, whereas the low-drive circuit may modify the output voltage to approximate an input voltage of the non-resistive load driver, and maintain a steady state output voltage. The low-drive circuit consumes less current than the high-drive circuit. The non-resistive load driver consumes less power and use less chip space.

Further modifications and alternative embodiments of this invention will be apparent to those skilled in the art in view of this description. For example, the non-resistive load driver 100 may be implemented using a single driver with multiple modes, such as a low-drive mode and a high-drive mode, by changing a bias current of the non-resistive load driver 100 between a high current mode and a low current mode. Accordingly, this description is to be construed as illustrative only and is for the purpose of teaching those skilled in the art the manner of carrying out the invention. Various changes may be made in the shape, size and arrangement and types of components or devices. For example, equivalent elements or materials may be substituted for those illustrated and described herein, and certain features of the invention may be utilized independently of the use of other features, all as would be apparent to one skilled in the art after having the benefit of this description of the invention. Alternative embodiments are contemplated and are within the spirit and scope of the following claims.

What is claimed is:

1. A method comprising:
    driving a load to an initial voltage within a voltage window, the voltage window based on an input voltage and an offset voltage; and
    driving the load, while the initial voltage is non-zero, to approximately the input voltage responsive to the driving of the load to the initial voltage.

2. The method of claim 1, wherein at least a portion of the load is capacitive.

3. The method of claim 1, wherein at least a portion of the load is inductive.

4. The method of claim 1, wherein the voltage window is based on a sum of the input voltage and the offset voltage, and a difference between the input voltage and the offset voltage.

5. The method of claim 1, further comprising utilizing one or more control signals to activate at least one of a high-drive mode and a low-drive mode, the high drive mode including driving the load with the initial voltage that is within the voltage window, and the low drive mode including driving the load from the initial voltage to approximately the input voltage.

6. The method of claim 5, wherein operating in the high-drive mode consumes less current than operating in the low drive mode does.

7. The method of claim 5, further comprising utilizing a further one or more control signals to activate a no-drive mode, and during the no-drive mode, not driving a portion of the load that is capacitive.

8. The method of claim 5, wherein operating in the high-drive mode and the low-drive mode includes driving the load to a rail-to-rail voltage.

9. A load driver to drive a load, the load driver comprising:
    a high drive circuit coupled with an input voltage and the load;
    a low drive circuit coupled with the input voltage and the load; and
    a control circuit coupled with the high drive circuit and the low drive circuit and configured to activate at least one of the high drive circuit and the low drive circuit, the activated high drive circuit configured to drive the load to an output voltage within a voltage range defined by the input voltage and a range voltage, and the activated low drive circuit configured to adjust the output voltage while the output voltage is non-zero to approximate the input voltage, wherein the control circuit is configured to activate the low drive signal, while the output voltage is non-zero, and responsive to the activated high drive circuit driving the load to the output voltage.

10. The load driver of claim 9, wherein the at least a portion of the load is capacitive.

11. The load driver of claim 10, wherein responsive to being activated by the control circuit, the high drive circuit is configured to drive the load based on a first bias current, and the low drive circuit is configured to adjust the output voltage based on a second bias current.

12. The load driver of claim 9, wherein the voltage range is between a first voltage and a second voltage, the first voltage being a difference between the input voltage and the range voltage, and the second voltage being a sum of the input voltage and the range voltage, and wherein the range voltage is a programmable value.

13. A system comprising:
    a voltage generator to provide an input voltage;
    a load; and
    a load driver, the load driver including:
        a first circuit coupled with the voltage generator and the load, the first circuit configured to drive the load to approximately a threshold voltage level that is within a voltage window; and
        a second circuit coupled with the voltage generator and the load, the second circuit configured to drive the load to approximately the input voltage, responsive to the first circuit driving the load to approximately the threshold voltage, and while the approximate threshold voltage is non-zero.

14. The system of claim 13, wherein at least a portion of the load is capacitive, and at least a portion of the load is resistive.

15. The system of claim 13, wherein at least a portion of the load is inductive, and at least a portion of the load is resistive.

16. The system of claim 13, wherein the voltage window includes a voltage range defined by a first voltage and a second voltage, the first voltage being a difference between the input voltage and an offset voltage, and the second voltage being a sum of the input voltage and the offset voltage.

17. The system of claim 16, wherein the first circuit of the load driver includes:
    a first comparator configured to compare the first voltage to a load voltage of the load;
    a first switch configured to permit charging of a capacitor of the load based on the first voltage being greater than the load voltage;
    a second comparator configured to compare the second voltage to the load voltage; and
    a second switch configured to permit a discharging of the capacitor of the load based on the second voltage being less than the load voltage.

18. The system of claim 13, wherein the second circuit is configured to drive the load to approximately the input voltage through cancelling an offset voltage associated with driving the load to approximately the threshold voltage level.

19. The system of claim 13, wherein the first circuit and the second circuit are configured to drive the load to a rail-to-rail voltage.

20. The system of claim 13, further comprising a control logic having a control signal generator configured to generate one or more control signals to activate or deactivate the first circuit, and to activate or deactivate the second circuit, wherein the control logic is configured to activate the first circuit in a high drive mode and to activate the second circuit in a low drive mode.

* * * * *